(12) United States Patent
Noguchi

(10) Patent No.: US 7,170,099 B2
(45) Date of Patent: Jan. 30, 2007

(54) OPTICAL SEMICONDUCTOR DEVICE AND A METHOD FOR MANUFACTURING THE SAME

(75) Inventor: Yoshio Noguchi, Fukuoka-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/094,301

(22) Filed: Mar. 31, 2005

(65) Prior Publication Data

US 2005/0218492 A1    Oct. 6, 2005

(30) Foreign Application Priority Data

Mar. 31, 2004    (JP)    ............... 2004-106772

(51) Int. Cl.
*H01L 27/15* (2006.01)
*H01L 31/12* (2006.01)
*H01L 33/00* (2006.01)

(52) U.S. Cl. ............... 257/82; 257/83; 257/84; 257/678; 438/25; 438/26; 250/214.1; 250/551

(58) Field of Classification Search ........ 257/E31.095, 257/678, 82–84; 438/25, 26; 250/214.1, 250/551, 239, 227.24; 357/17, 72
See application file for complete search history.

(56) References Cited

U.S. PATENT DOCUMENTS

| | | | |
|---|---|---|---|
| 4,058,821 A * | 11/1977 | Miyoshi et al. | ............... 257/82 |
| 5,148,243 A * | 9/1992 | Merrick et al. | ............... 257/81 |
| 5,770,867 A | 6/1998 | Sata et al. | |
| 6,177,689 B1 | 1/2001 | Torazawa | |
| 6,201,263 B1 | 3/2001 | Mizuuchi | |
| 6,507,035 B1 * | 1/2003 | Hasegawa et al. | .......... 250/551 |
| 6,548,880 B1 * | 4/2003 | Hirasawa | .............. 257/433 |
| 6,588,946 B1 | 7/2003 | Mitsui | |
| 6,623,178 B1 * | 9/2003 | Sakurai et al. | ............... 385/92 |
| 6,737,680 B2 | 5/2004 | Hasegawa | |
| 6,777,703 B2 * | 8/2004 | Morikawa | .......... 250/551 |
| 6,885,016 B2 * | 4/2005 | Worley et al. | .......... 250/551 |
| 6,919,625 B2 * | 7/2005 | O'Shea et al. | .......... 257/214 R |
| 7,009,166 B2 * | 3/2006 | Shoji | .............. 250/214 R |
| 2005/0023441 A1 | 2/2005 | Inoue et al. | |

FOREIGN PATENT DOCUMENTS

JP    59177978 A  * 10/1984
JP    2003-008050    1/2003

* cited by examiner

*Primary Examiner*—Kenneth Parker
*Assistant Examiner*—Chris C. Chu
(74) *Attorney, Agent, or Firm*—Banner & Witcoff, Ltd

(57) ABSTRACT

An optical semiconductor device includes a first set of lead frames having a first set of element mounting beds, a second set of lead frames having a second set of element mounting beds, which are arranged substantially on a same plane as the first set of element mounting beds.

A light-emitting element is mounted on one of the first set of element mounting beds and having a pair of electrodes connected to the first set of lead frames respectively.

A light-receiving element is arranged at a position facing to the light-emitting element and having a pair of electrodes connected to the second set of lead frames respectively. A supporting means is mounted on the second set of element mounting beds for supporting the light-receiving element at the position facing to the light-emitting element and for receiving a light emitted from the light-emitting element.

11 Claims, 6 Drawing Sheets

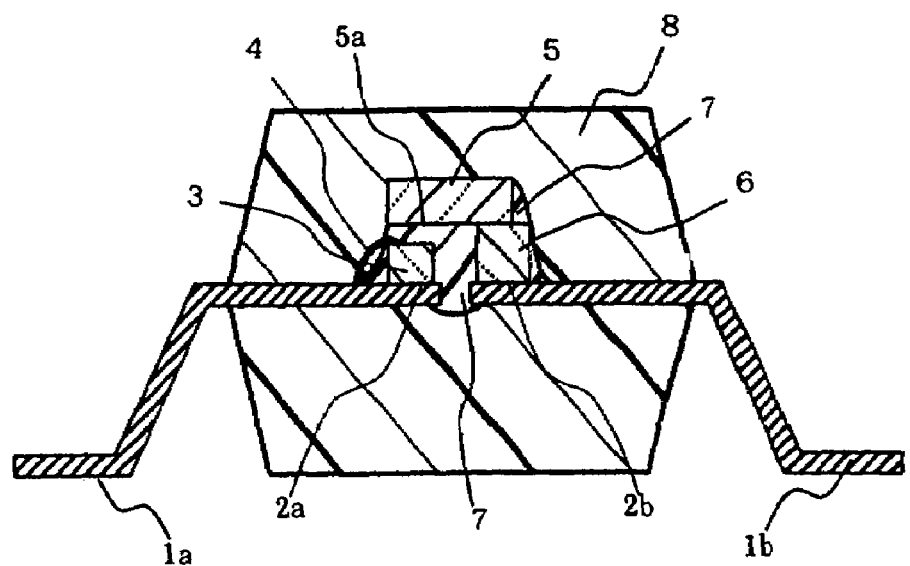
Fig.6
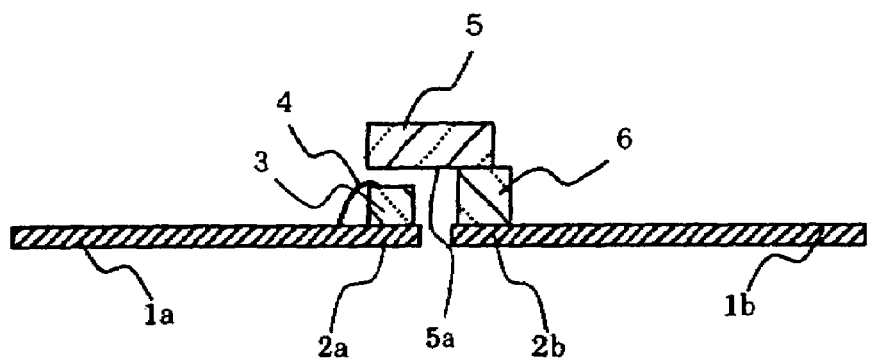
Fig.7-a
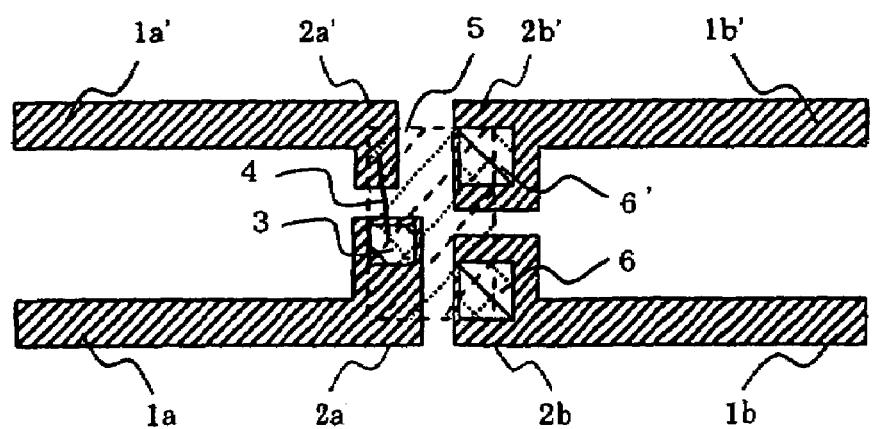
Fig.7-b

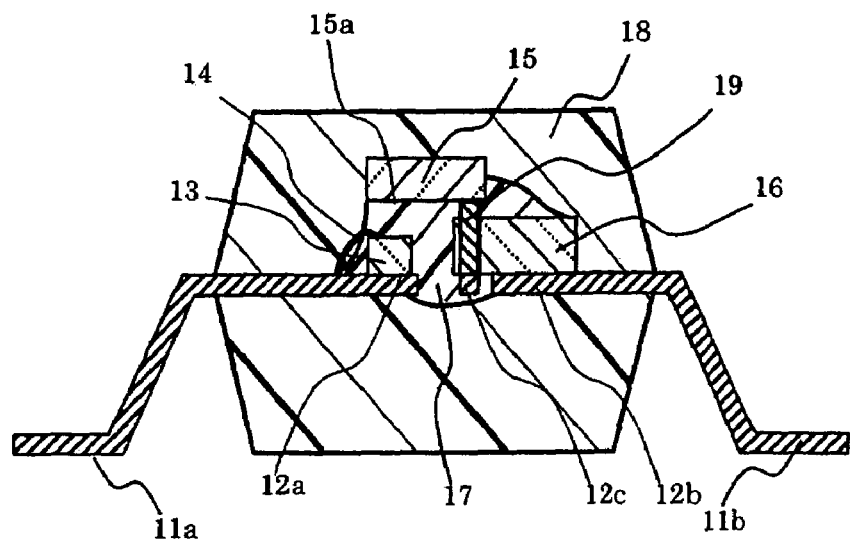
Fig.10
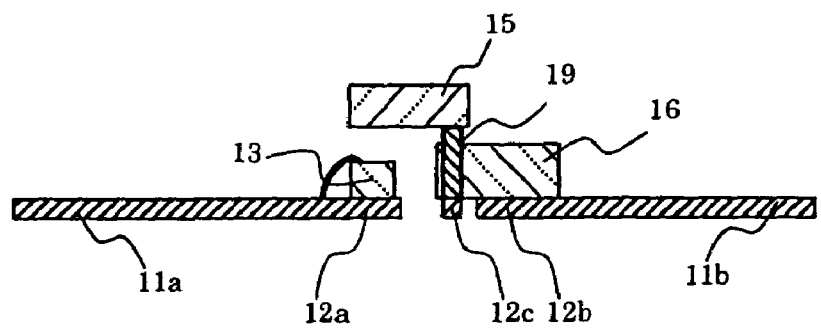
Fig.11-a
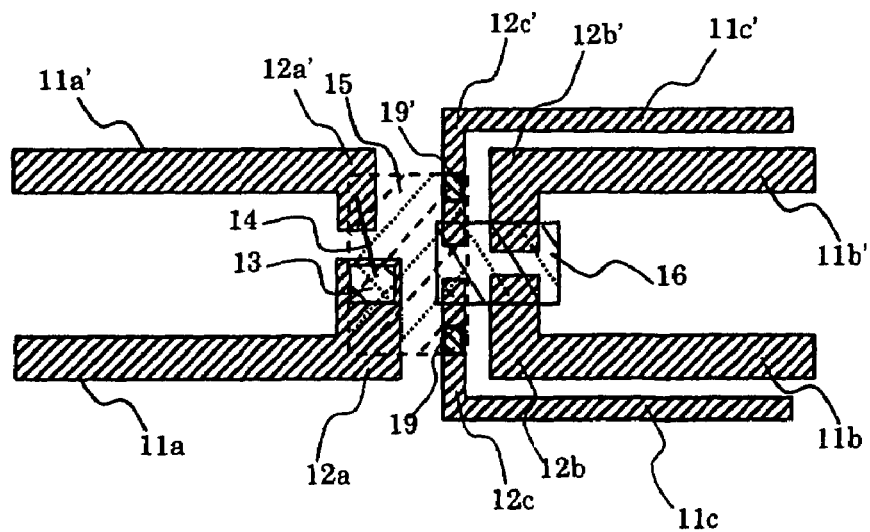
Fig.11-b

OPTICAL SEMICONDUCTOR DEVICE AND A METHOD FOR MANUFACTURING THE SAME

CROSS-REFERENCE TO RELATED APPLICATIONS

This application is based upon and claims the benefit of priority from the prior Japanese Patent Application No. 2004-106772, filed Mar. 31, 2004, the entire contents of which are incorporated herein by reference.

FIELD OF THE INVENTION

The present invention relates to an optical semiconductor device having a structure that a light-emitting element and a light-receiving element are arranged facing to each other and a method for manufacturing it.

BACKGROUND OF THE INVENTION

An optical semiconductor device such as a photocoupler or a photo relay is generally provided with a light-emitting element such as a light-emitting diode, a light-receiving element such as an optical electromotive diode, for example, and a driving MOSFET mounted on lead frames respectively, wherein the light-emitting element and the light-receiving element are arranged facing to each other and are sealed in a resin mold (for example, refer to Japanese Patent Application 2003-8050).

FIG. 1 shows an example of a photorelay of the double seal structure of a conventional optical semiconductor device. As shown in the drawing, a light-emitting element 103 is mounted on a lead frame 101a, and a light-receiving element 105 and a MOSFET 106 are mounted on a lead frame 101b, wherein they are arranged facing to each other. These elements are primarily sealed by a light-transmitting resin 107 and are secondarily sealed by a light-blocking resin 108. The light-emitting element 103 is bonded to the lead frame (not shown) and the light-receiving element 105 is bonded to MOSFET 106 connected to a lead frame (not shown) by wires 104.

This photo relay is formed as described below. Firstly, as shown in FIG. 2, the light-emitting element 103, the light-receiving element 105, and the MOSFET 106 are respectively mounted on the lead frames 101a and 101b processed to be bent at their end portions. Then, the lead frames 101a and 101b are so arranged that the light-emitting element 103 and the light-receiving element 105 are facing to each other, as shown in FIG. 3.

Next, the light-emitting element 103, the light-receiving element 105 and the MOSFET 106 are primarily sealed by the light-transmitting resin 107 to form a light transfer path, as shown in FIG. 4. Then, these elements primarily sealed are secondarily sealed by the light-blocking resin 108 to block off the light and protect the elements as shown in FIG. 5. Thereafter, the lead frames 101a and 101b are formed to produce the optical semiconductor device shown in FIG. 1.

In recent years, miniaturization of optical semiconductor devices has been strongly required in correspondence to realization of high performance of a semiconductor device and improvement of assembly density. However, since the light-emitting element 103 and the MOSFET 106 are arranged side by side on the lead frame 101b, as mentioned above, miniaturization of the package is difficult for such structure of the optical semiconductor devices.

Further, a method for manufacturing the devices is required to include a step of arranging the lead frames so that the light-emitting element and the light-receiving element are facing to each other, and a step of sealing them with retaining them in the situation described above. Thus it is difficult in the conventional manufacturing steps to shorten the lead time and to cut-down the manufacturing cost by reduction of the number of steps.

SUMMARY OF THE INVENTION

According to an embodiment of the present invention, there is provided an optical semiconductor device, which includes;

a first set of lead frames having a first set of element mounting beds, a second set of lead frames having a second set of element mounting beds, the second set of element mounting beds being arranged substantially on a same plane as the first set of element mounting beds, a light-emitting element mounted on one of the first set of element mounting beds and having a pair of electrodes connected to the first set of lead frames respectively, a light-receiving element supported by a supporting member mounted on the second set of element mounting beds for supporting the light-receiving element at a position facing to the light-emitting element and for receiving a light emitted from the light-emitting element, and a supporting means mounted on the second set of element mounting beds for supporting the light-receiving element at the position facing to the light-emitting element and for receiving a light emitted from the light-emitting element.

According to another embodiment of the present invention, there is provided a method for manufacturing an optical semiconductor device, which includes steps of;

arranging a first set of lead frames having a first set of element mounting beds, arranging a second set of lead frames having a second set of element mounting beds, which is arranged substantially on a same plane as the first set of element mounting beds, mounting a light-emitting element on the first set of element mounting beds and connecting it to the first set of lead frames, mounting a supporting means for supporting a light-receiving element on the second set of element mounting beds, mounting the light-receiving element on the supporting member, so that the light-receiving element faces to the light-emitting element, and connecting the light-receiving element to the second set of lead frames through the supporting member.

BRIEF DESCRIPTION OF THE DRAWINGS

FIG. 6 is a cross-sectional view showing an optical semiconductor device according to a first embodiment of the present invention, FIG. 7-a is a cross-sectional view of the optical semiconductor device for explaining a method for manufacturing an optical semiconductor device according to the first embodiment of the present invention, FIG. 7-*b* is a top view of the optical semiconductor device for explaining the method for manufacturing the optical semiconductor device according to the first embodiment of the present invention, FIG. 10 is a cross-sectional view showing the optical semiconductor device according to a second embodiment of the present invention, FIG. 11-*a* is a cross-sectional view of the optical semiconductor device for explaining the method for manufacturing a optical semiconductor device according to the second embodiment of the present invention, FIG. 11-*b* is a top view of the optical semiconductor device for explaining the method for manufacturing an optical semiconductor device according to the second embodiment of the present invention

DETAILED DESCRIPTION OF THE INVENTION

Figure 1:
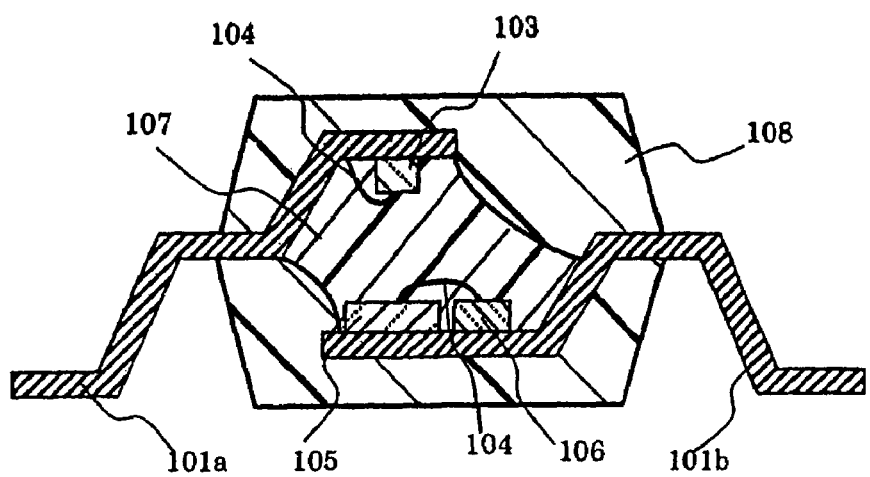
FIG. 1 is a cross-sectional view showing a conventional optical semiconductor device.
Figure 2:
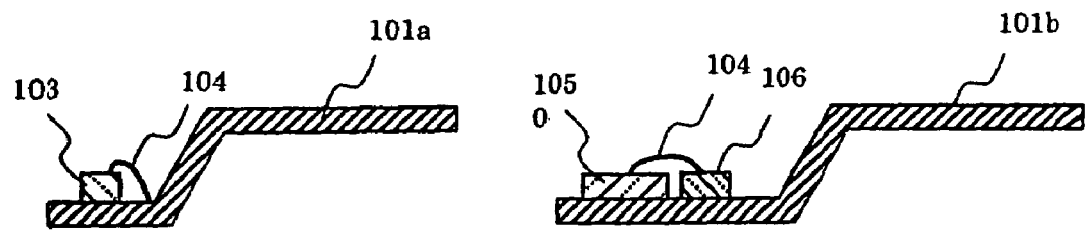
FIGS. 2, 3, 4 and 5 are cross-sectional views of a conventional optical semiconductor device for explaining a method for manufacturing a conventional optical semiconductor device.
Figure 3:
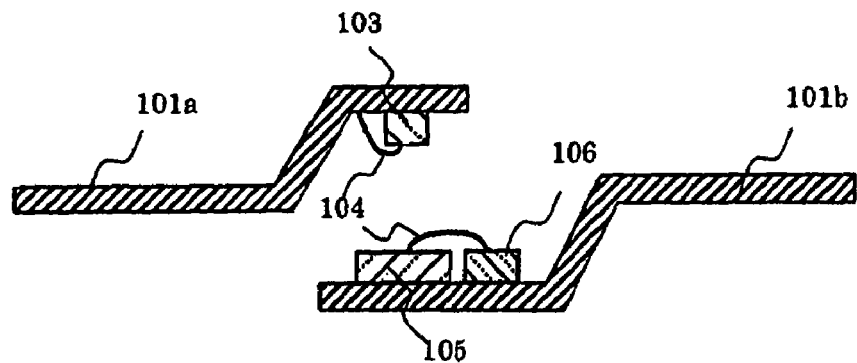
Figure 4:
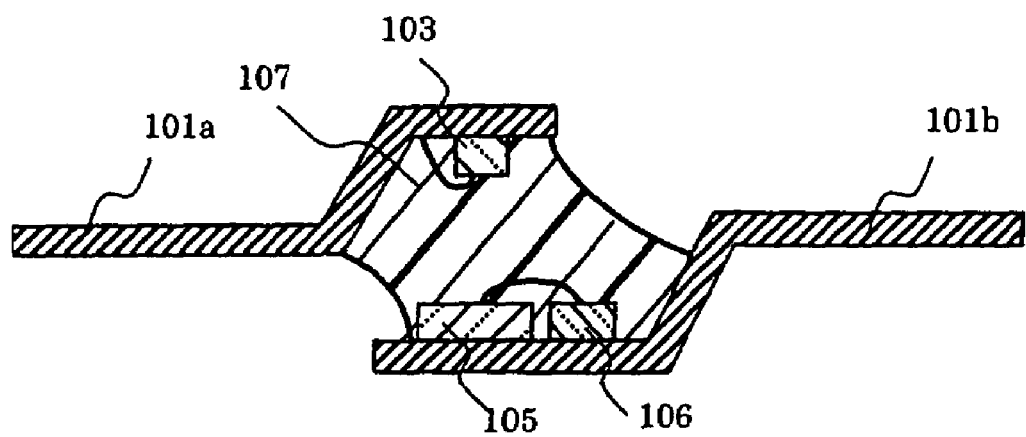
Figure 5:
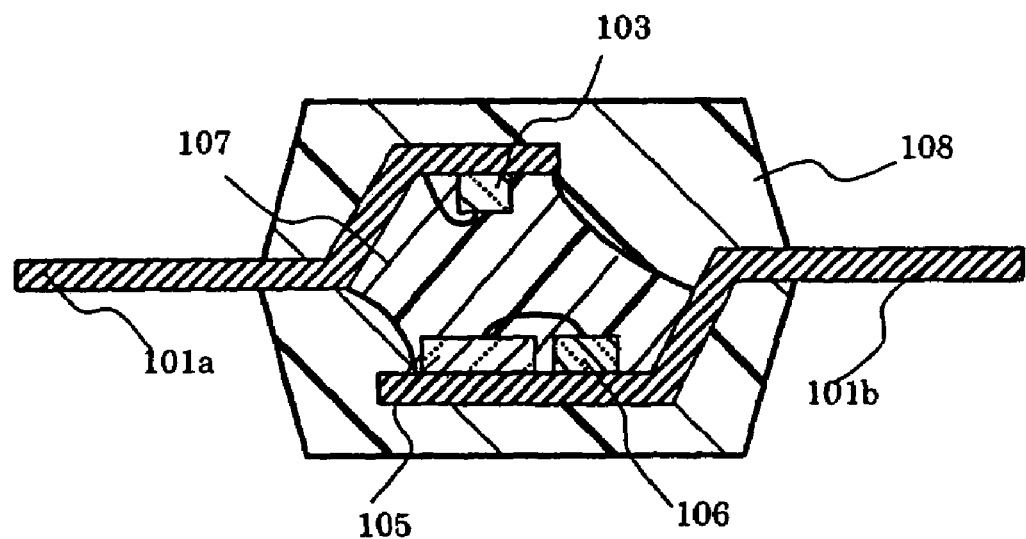

The embodiments of the present invention will be explained hereunder with reference to the accompanying drawings.

EMBODIMENT 1

FIG. 6 shows a cross sectional view of the optical semiconductor device of this embodiment. As shown in the drawing, a light-emitting element 3 is mounted on a first element mounting bed 2*a* formed on one (1*a*) of a first set of lead frames 1*a*, 1*a*'. The light-emitting element 3 is, for example, a light emitting diode. An electrode (not shown) of the light-emitting element 3 is connected to the bed 2*a* and another electrode (not shown) of the light-emitting element 3 is connected to another one (1*a*') of the first set of lead frames by a wire 4. A light-receiving element 5, which is a photo diode or a photo transistor, for example, the light-receiving element is a photo diode is so arranged that a light receiving surface 5*a* of the light-receiving element 5 may face the light-emitting element 3 to receive a light emitted from the light-emitting element 3. A part of the light-receiving element 5 is supported by a pair of MOSFET pellets 6, 6', which are mounted on second element mounting beds 2*b*, 2*b*' formed on a second set of frames 1*b*, 1*b*' respectively by flip chip bonding (FCB). The MOSFET pellets 6, 6' include a MOSFET circuit forming a control circuit (not shown), which is connected to each of a pair of electrodes (not shown) of the light-receiving element through the flip chip bonding.

The light-emitting element 3, the light-receiving element 5 and the pair of MOSFET pellets 6, 6' are sealed by light-transmitting resin 7 for primary sealing, so that the light-emitting element 3 and the light-receiving element 5 may be fixed to each other and a light transfer path may be formed between them. Further, secondary sealing is applied to cover the light-emitting element 3, the light-receiving element 5, the pair of MOSFET pellets 6, 6' and the primary sealing resin 7 with light-blocking resin 8.

In the optical semiconductor device, an external electric signal is supplied through the first set of lead frames 1*a*, 1*a*' to the light-emitting element 3 to emits a light signal. The light signal is transmitted to the light-receiving element 5 via the primary sealing resin 7. Then, the light signal is received by the light-receiving element 5 and is converted into an electric signal. The electric signal is then outputted through the MOSFET circuits of the pair of pellets 6, 6' to the second set of lead frames 1*b*, 1*b*'.

A method for assembling the optical semiconductor device is described below. Firstly, as shown in the cross sectional view in FIG. 7-*a* and the top view in FIG. 7-*b*, the first and the second set of lead frames 1*a*, 1*a*' and 1*b*, 1*b*' which are formed in a predetermined shape and at a predetermined interval by pressing and etching a conductive plate made of such a metal material as Al or Cu with all of the flames being united with each other (not shown) at their end portions initially. The light-emitting element 3 is mounted on the bed 2*a* and connected to the bed 2*a* and 2*a*' of the first set of lead frame 1*a* and 1*a*'. The MOSFET pellets 6, 6' are mounted on and connected respectively to the beds 2*b* and 2*b*' of the second set of lead frames 1*b*, 1*b*'. The light-receiving element 5 is mounted on the MOSFET pellets 6, 6', so that the light receiving surface 5*a* of the light-receiving element 5 may face the light-emitting element 3.

Figure 8:
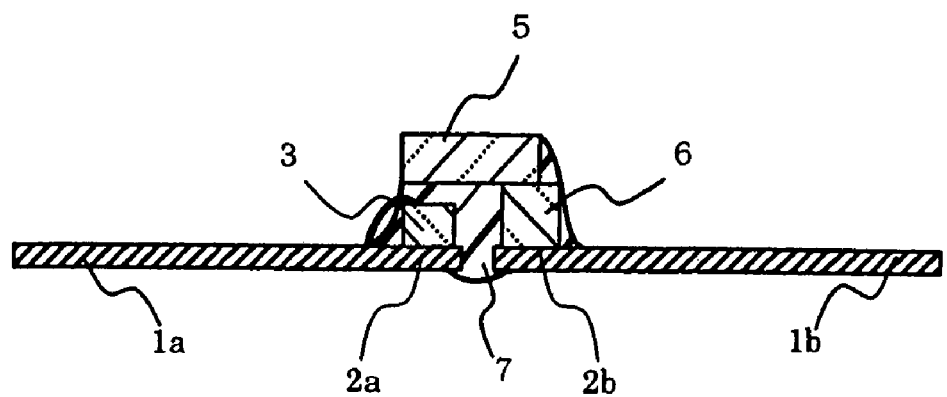
FIGS. 8 and 9 are cross-sectional views of the optical semiconductor device for explaining the method for manufacturing the optical semiconductor device according to the first embodiment of the present invention.
Figure 9:
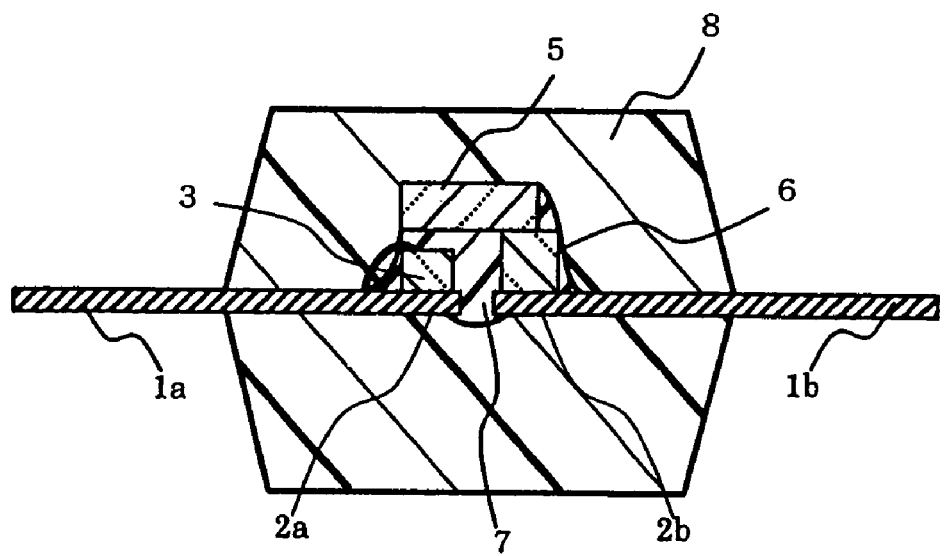

Next, as shown in FIG. 8, the light-emitting element 3, the light-receiving element 5 and the MOSFET pellets 6, 6' are sealed by the light-transmitting resin 7 for primary sealing so that they may be combined with each other and a light transfer path may be form. Then, as shown in FIG. 9, the elements combined by the primary sealing resin 7 are sealed with the light-blocking resin 8 for secondary sealing. Finally, the first and second set of lead frames 1*a*, 1*a*' and 1*b*, 1*b*' exposed from the secondary sealing resin 8 are separated from each other by cutting at their edge portions and are bent for assembly. Thus, the optical semiconductor device shown in FIG. 6 is completed.

According to the embodiment described, the package size of the optical semiconductor device can be miniaturized, since the light-receiving element and the MOSFET pellets can be arranged three-dimensionally instead of conventional two-dimensional arrangement.

According to the embodiment of the present invention, the method for manufacturing the optical semiconductor device eliminate the conventional step of retaining the first and second set of lead frames to face each other for primary sealing, since the light-emitting element and the light-receiving element are mounted on the first and second element mounting bed 2*a* and 2*b*, 2*b*', which form a part of the first and second set of lead frames, are arranged on the same plane. Thus the number of manufacturing steps can be reduced. Due to the three dimensional structure, height of the optical semiconductor device can be controlled easily. Furthermore, displacement of elements in the plain formed by the first and second set of lead frames 1*a*, 1*a*' and 1*b*, 1*b*' can be avoided by using the first and second set of lead frames united with each other, and thus variations in the characteristics of the optical semiconductor device can be avoided.

EMBODIMENT 2

FIG. 10 shows a cross sectional view of the optical semiconductor device of according to another embodiment of the present invention. As shown in the drawing, as in the case of the embodiment 1, a light-emitting element 13 is mounted on a bed 12*a* formed in one (11*a*) of a first set of lead frames 11*a*, 11*a*'. An electrode (not shown) of the light-emitting element 13 is connected to the bed 12*a* and another electrode (not shown) of the light-emitting element 13 is connected to another one (11a') of the first set of lead frames by a wire 14. A light-receiving element 15 is so arranged that a light receiving surface 15a of the light-receiving element 15 may face the light-emitting element 13 to receive a light emitted from the light-emitting element 13. A part of the light-receiving element 15 is supported by a pair of conductive dummy pellets 19, 19', which are mounted on a third set of element mounting beds 12c, 12c' extending between the first set of beds 12a, 12a' and the second set of beds 12b, 12b'. The light-receiving element 15 is also electrically connected to a MOSFET pellet 16 through the conductive dummy pellets 19, 19'.

As in the case of the embodiment 1, the light-emitting element 13 and the light-receiving element 15 are sealed by a light-transmitting resin 17 for primary sealing, as well as the MOSFET pellet 16 and the conductive dummy pellets 19, 19' to combine them and to form a light transfer path. Thereafter, the elements combined by the primary sealing resin 17 are sealed with a light-blocking resin 18 for secondary sealing.

In the optical semiconductor device, as in the case of the embodiment 1, an external electric signal is supplied to the light-emitting element 13 through the first set of lead frames and the light-emitting element 13 emits light signal. Then, the light signal is transmitted to the light-receiving element 15 via the primary sealing resin 17. Then the electric signal is converted by the light-receiving element 15 and is supplied to the first set of lead frames via the MOSFET 16.

A method for assembling the optical semiconductor device is described below. Firstly, as shown in FIG. 11-a and in FIG. 11-b, the first, the second and a third set of lead frames 11a, 11a', 11b, 11b' and 11c, 11c', which are formed in a predetermined shape and at a predetermined interval by pressing and etching a conductive plate made of such a metal material as Al or Cu with all of the flames being united with each other (not shown) at their end portions initially, as in the case of the embodiment 1.

Here, the third set of lead frames 11c, 11c' has a third set of element mounting beds 12c, 12c' extending between the first set of beds 12a, 12a' and the second set of beds 12b, 12b'.

The light-emitting element 13 is mounted on and connected to the bed 12a of the lead frame 11a in the first set of lead frames 11a, 11a'. The MOSFET pellet 16 is mounted on and connected to the beds 12b, 12b' of the second set of lead frames 11b in the second set of lead frames 11b, 11b'. A part of the MOSFET 16 is supported by the third set of element mounting beds 12c, 12c' of the third set of lead frames 11c, 11c'.

A part of the light-receiving element 15 is supported by a pair of conductive dummy pellets 19, 19', which are mounted on a third set of element mounting beds 12c, 12c' extending between the first set of beds 12a, 12a' and the second set of beds 12b, 12b'. The light-receiving element 15 is also electrically connected to a MOSFET pellet 16 through the conductive dummy pellets 19, 19'. The light-receiving element 15 is mounted on the dummy pellets 19, 19', so that the light receiving surface 15a of the light-receiving element 15 may face the light-emitting element 13.

Figure 12:
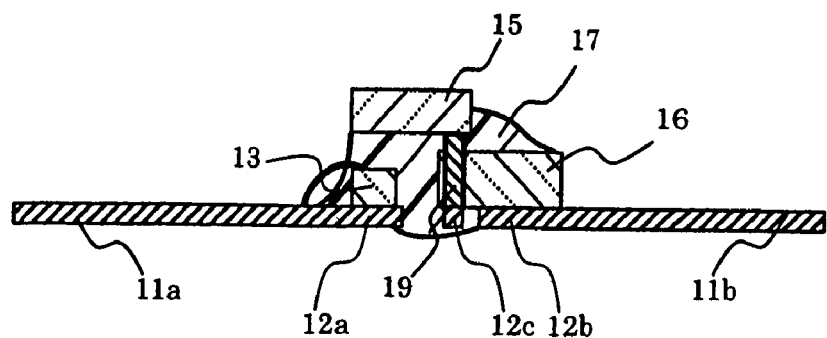
FIGS. 12, 13 and 14 are cross-sectional views of the optical semiconductor device for explaining the method for manufacturing an optical semiconductor device according to the second embodiment of the present invention.
Figure 13:
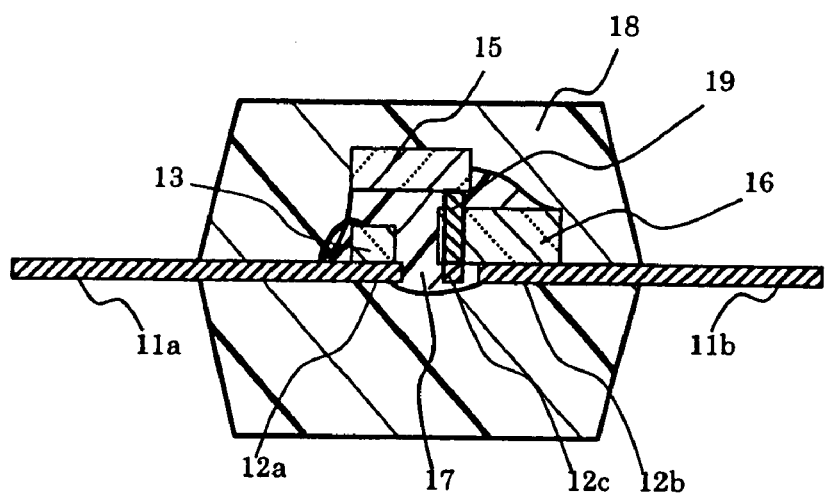

Then, as shown in FIG. 12, the light-emitting element 13, the light-receiving element 15, the MOSFET pellet 16 and the dummy pellets 19, 19' are sealed by the light-transmitting resin 17 for primary sealing to combine them with each other and to form a light transfer path. Thus, the elements combined by the resin 17 are sealed in the light-blocking resin 18 for secondary sealing, as shown in FIG. 13.

Figure 14:
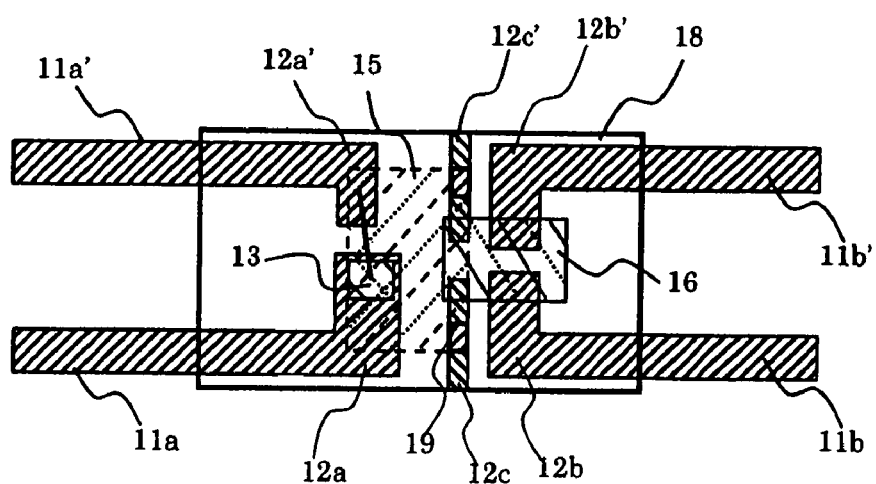

Finally, as shown in FIG. 14, the exposed part of the third set of lead frames 11c, 11c' from the resin 18 for secondary sealing is cut and removed. The first and second set of lead frames 11a, 11a' and 11b, 11b' exposed from the resin 18 for secondary sealing are separated from each other by being cut at their end portions and are bent for assembly, and thus the optical semiconductor device shown in FIG. 10 is completed.

In this embodiment, the material of the dummy pellet is not specified particularly, and various conductive and non-conductive materials such as the ceramics series, silicon series, and metal series can be selected properly depending on the design of the internal element.

In addition, in the embodiments described, the first and second sets of lead frames, which are united with each other, are used. However, it is not necessary using the lead frames united with each other since the lead frames separately formed may be arranged on the same plane under a position control. Further, this optical semiconductor device may be formed continuously using hoop-shaped frames.

Further, the connecting method for connecting the elements to each other on the bed is not specified particularly, since resin junction, eutectic junction or FCB can be selected properly.

Although the MOSFET is used in the embodiments, the effects such as reduction in the number of steps, suppression of variations in the characteristics, and miniaturization of the package can be obtained when the dummy pellet is mounted on the light-receiving element, even in an optical semiconductor device having no MOSFET. The dummy pellet is not necessarily remained on the bed in the optical semiconductor device but the bed may be removed after resin sealing.

Other embodiments of the present invention will be apparent to those skilled in the art from consideration of the specification and practice of the invention disclosed herein. It is intended that the specification and example embodiments be considered as exemplary only, with a true scope and spirit of the invention being indicated by the following.

What is claimed is:

1. An optical semiconductor device, which comprises:
   a first set of lead frames having a first set of element mounting beds,
   a second set of lead frames having a second set of element mounting beds, the second set of element mounting beds being arranged substantially on a same plane as the first set of element mounting beds,
   a light-emitting element mounted on one of the first set of element mounting beds and having a pair of electrodes connected to the first set of lead frames respectively, and
   a light-receiving element supported by a supporting member and configured to receive a light emitted from the light-emitting element, the supporting member mounted on the second set of element mounting beds that supports the light-receiving element.

2. The optical semiconductor device according to claim 1, wherein the supporting member is a semiconductor pellet having a control element that controls the light-receiving element is formed.

3. The optical semiconductor device according to claim 2, wherein the semiconductor pellet supports the light-receiving element with a light receiving surface facing to the light-emitting element.

4. The optical semiconductor device according to claim 3, wherein the semiconductor pellet is composed of a pair of semiconductor pellets each of which is mounted on the second set of element mounting beds respectively and is connected to each of a pair of electrodes of the light-receiving element, and wherein the pellets include the control circuit formed by a MOSFET element.

5. The optical semiconductor device according to claim 4, wherein the first set of lead frames has a pair of lead frames each having one of the first set of element mounting beds, on one of which the light-emitting element is mounted, and wherein the second set of lead frames has a pair of lead frames each having one of the second set of element mounting beds, on which each one of the pair of MOSFET pellets is mounted, and wherein each one of a pair of electrode of the light-receiving element is connected to each one of the pair of MOSFET pellets by a flip chip bonding, thereby being supported by the pair of MOSFET pellets.

6. The optical semiconductor device according to claim 5, wherein at least the light-emitting element, the light-receiving element and the semiconductor pellets are sealed by a light-transmitting resin for primary sealing to form a light transfer path and are sealed by a light-blocking resin for secondary sealing to enclose the elements sealed by the light-transmitting resin.

7. The optical semiconductor device according to claim 6, wherein the light-emitting element is a light-emitting diode and the light-receiving element is a photo diode.

8. The optical semiconductor device according to claim 3, wherein the semiconductor pellet is composed of a pair of semiconductor pellets each of which is mounted on the second set of element mounting beds respectively and is connected to each of a pair of electrodes of the light-receiving element, and wherein the pellets include the control circuit.

9. The optical semiconductor device according to claim 2, wherein the semiconductor pellet is composed of a pair of semiconductor pellets each of which is mounted on the second set of element mounting beds respectively and is connected to each of a pair of electrodes of the light-receiving element, and wherein the pellets include the control circuit formed by a MOSFET element.

10. The optical semiconductor device according to claim 1, wherein the supporting member supports the light-receiving element with a light receiving surface facing to the light-emitting element.

11. The optical semiconductor device according to claim 1, further comprising a sealing member that seals at least the light-emitting element, the light-receiving element and the supporting member.

* * * * *